United States Patent
Ide

(12) 
(10) Patent No.: US 6,536,455 B1
(45) Date of Patent: Mar. 25, 2003

(54) DIFFUSION REACTOR WITH SLOPED BOTTOM PLATE SUITABLE FOR CLEANING THE SAME

(75) Inventor: Shigeaki Ide, Kumamoto (JP)

(73) Assignee: NEC Corporation, Tokyo (JP)

( * ) Notice: Subject to any disclaimer, the term of this patent is extended or adjusted under 35 U.S.C. 154(b) by 102 days.

(21) Appl. No.: 09/662,798

(22) Filed: Sep. 15, 2000

(30) Foreign Application Priority Data

Sep. 16, 1999 (JP) .......................................... 11-262554

(51) Int. Cl.⁷ ................................................. B08B 9/00
(52) U.S. Cl. .............................. 134/166 R; 134/169 R; 134/171; 134/200; 118/317
(58) Field of Search ................. 134/104.2, 105, 134/107, 198, 200, 166 R, 169 R, 171; 118/317

(56) References Cited

U.S. PATENT DOCUMENTS

| | | | |
|---|---|---|---|
| 3,630,777 A | * 12/1971 | Ishizawa et al. | 134/169 R |
| 4,294,271 A | * 10/1981 | Intrater et al. | 134/113 |
| 4,381,016 A | * 4/1983 | Douglas et al. | 134/170 |
| 6,203,623 B1 | * 3/2001 | Xia | 134/1 |

FOREIGN PATENT DOCUMENTS

| JP | 61176113 A | * 8/1986 |
|---|---|---|
| JP | 08008224 A | * 1/1996 |

* cited by examiner

*Primary Examiner*—Randy Gulakowski
*Assistant Examiner*—Joseph Perrin
(74) *Attorney, Agent, or Firm*—Young & Thompson

(57) ABSTRACT

A cleaning system for a reaction chamber having jigs and top and bottom openings includes a cleaning solution supplier under the top opening for spraying a cleaning solution within the reaction chamber to supply the cleaning solution onto an inner wall of the reaction chamber and surfaces of the jigs, and a sloped bottom plate that closes the bottom opening so that the cleaning solution falls onto the sloped bottom plate and flows across the sloped bottom plate to a drain.

10 Claims, 2 Drawing Sheets

DIFFUSION REACTOR WITH SLOPED BOTTOM PLATE SUITABLE FOR CLEANING THE SAME

BACKGROUND OF THE INVENTION

The present invention relates to a method of cleaning a diffusion reactor and an improved diffusion reactor suitable for cleaning the same, and more particularly to a method of efficiently cleaning depositions on an inner wall or jigs of a reaction chamber of a diffusion reactor and a diffusion reactor having a cleaning mechanism.

A diffusion reactor has a reaction tube or a reaction chamber which is cylindrically shaped. A plurality of semiconductor wafers are placed in the reaction chamber. The reaction chamber is heated at a predetermined temperature and further predetermined gases such as phosphate, nitrogen and oxygen are supplied to the reaction chamber, so that an impurity such as phosphorus is diffused into the semiconductor wafers.

As the diffusion reactor is repeatedly used, a deposition such as an impurity containing oxide film, for example, a phosphorus containing oxide film is deposited on the inner wall of the reaction chamber or the jigs in the reaction chamber. As the reaction chamber is heated, not only the intended impurity such as phosphorus is diffused into the semiconductor wafers but also the excess impurity in the deposition is re-diffused to the semiconductor wafers, whereby the impurity concentration of the semiconductor wafers exceeds the intended value. In order to prevent this problem, it is necessary that the deposition deposited on the inner wall of the reaction chamber or the jigs in the reaction chamber is removed periodically.

Japanese laid-open patent publication No. 61-176113 discloses the conventional cleaning method for cleaning the deposition adhered on the inner wall of the reaction chamber of the diffusion reactor. A roof side of the reaction chamber is provided with an air-intake/discharge port. A bottom side of the reaction chamber is also provided with an injection port for injecting a cleaning chemical and also with a discharge port for discharging the used cleaning chemical. The cleaning chemical is injected into the reaction chamber for allowing the cleaning chemical to be used as an etchant for carrying out a wet etching process. It is necessary that the roof side and the side wall contact the cleaning chemical. Namely, it is necessary that the predetermined amount of the cleaning chemical is reserved in the reaction chamber until the cleaning to the roof side and the side wall is completed. As a result, the bottom side of the reaction chamber is necessarily contacts the cleaning chemical for a longer time than necessary for cleaning the bottom side. This means that the bottom side of the reaction chamber is subjected to the over-etching due to the excessively long contact time with the cleaning, chemical. The over-etching to the bottom side of the reaction chamber reduces the thickness of the bottom side of the reaction chamber compared to the roof side and the side wall of the reaction chamber. A difference in thickness between the bottom side portion of the reaction chamber and the remaining portions thereof causes a difference in heat conductivity of the reaction chamber between the bottom side portion and the remaining portions thereof. This makes it difficult to uniformly heat the reaction chamber, whereby the required uniform impurity diffusion is not realized.

Further, when the reaction chamber is cleaned, the bottom of the reaction chamber is kept horizontal. This makes it difficult to discharge the used cleaning chemical completely. A small amount of the used cleaning chemical is likely to remain on the bottom side of the reaction chamber, whereby the remaining cleaning chemical further over-etches the bottom portion of the reaction chamber.

Furthermore, it is necessary that the injection port for injecting the cleaning chemical and the discharge port for discharging the used cleaning chemical are provided on a circumferential portion of the reaction chamber to avoid an uniformly heated region of the reaction chamber heated by the heater. This means it necessary to elongate the reaction chamber in its axial direction, whereby the diffusion reactor is enlarged in size and the necessary amount of the heat given by the heater is also increased.

In the above circumstances, it had been required to develop a novel diffusion reactor and method of cleaning the same free from the above problem.

SUMMARY OF THE INVENTION

Accordingly, it is an object of the present invention to provide a novel diffusion reactor free from the above problems.

It is a further object of the present invention to provide a novel diffusion reactor suitable for cleaning the same.

It is a still further object of the present invention to provide a novel diffusion reactor suitable for avoiding a cleaning chemical from over-etching the inner wall of a reaction chamber of the diffusion reactor.

It is yet a further object of the present invention to provide a novel diffusion reactor suitable for energy saving.

It is another object of the present invention to provide a novel method of cleaning a deposition on an inner wall of a reaction chamber of a diffusion reactor free from the above problems.

It is a further object of the present invention to provide a novel method of cleaning a deposition on an inner wall of a reaction chamber of a diffusion reactor without any over-etching to the inner wall of the reaction chamber by the cleaning chemical.

It is a still further object of the present invention to provide a novel method of cleaning a deposition on an inner wall of a reaction chamber of a diffusion reactor for realizing an energy saving.

The present invention provides a reaction chamber having jigs, top and bottom openings and a cleaning system. The cleaning system includes a cleaning solution supplier provided under the top opening for spraying a cleaning solution entirely within the reaction chamber to supply the cleaning solution on an inner wall of the reaction chamber and surfaces of the jigs, and a sloped bottom plate that closes the bottom opening so that the cleaning solution falls onto the sloped bottom plate and flows off of the sloped bottom plate.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
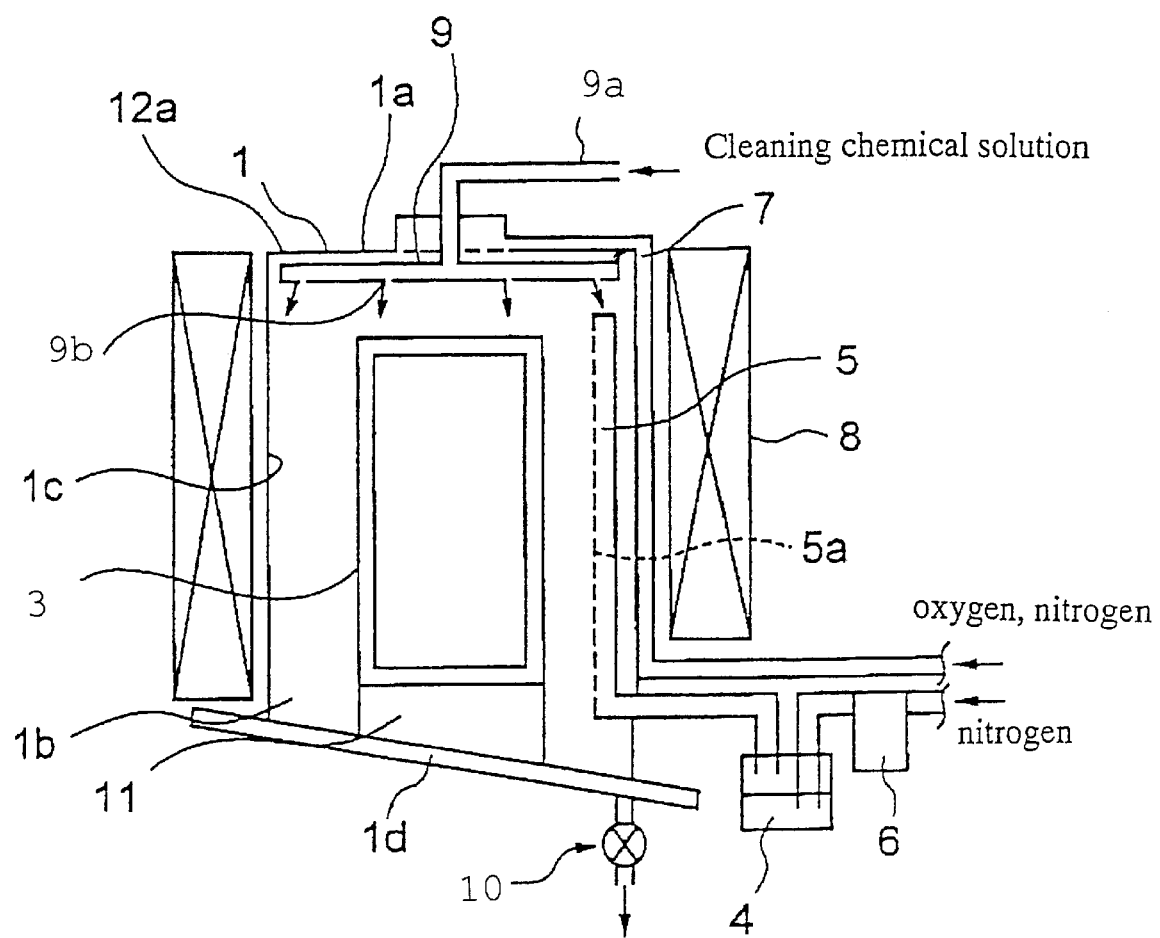
FIG. 1 is a cross sectional view illustrative of a novel diffusion reactor in a first embodiment in accordance with the present invention.

The present invention provides a reaction chamber having jigs, top and bottom openings and a cleaning system. The cleaning system includes a cleaning solution supplier provided under the top opening for showering a cleaning solution entirely within the reaction chamber to supply the cleaning solution entirely on an inner wall of the reaction chamber and surfaces of the jigs, and a sloped bottom plate provided to close the bottom opening so that the cleaning solution falls onto the sloped bottom plate and flows off of the sloped bottom plate.

It is preferable that the sloped bottom plate has a lower level portion provided with a drain for discharging the cleaning solution.

It is also preferable that the reaction chamber is cylindrically shaped and the cleaning solution supplier has a circular-shaped surface facing downwardly and the circular-shaped surface has a diameter slightly smaller than the reaction chamber, and the circular-shaped surface of the cleaning solution supplier has plural nozzle holes distributed over the circular-shaped surface.

It is also preferable that one of the jigs comprises a wafer boat for mounting plural semiconductor wafers and another of the jigs comprises a boat support provided on the sloped bottom plate for supporting the wafer boat.

It is further preferable that the sloped bottom plate is movable to allow the wafer boat to move in and out of the reaction chamber.

The cylindrically shaped reaction chamber has the top and bottom openings, and the cleaning solution supplier is provided in the top opening, whilst the sloped bottom floor is provided to close the bottom opening, so that the cleaning solution is supplied through the cleaning chemical supplier for etching the depositions and further the cleaning solution falls onto the sloped bottom floor and flows on the sloped bottom floor and is collected by the drain. Namely, the cleaning process is carried out without removing the cylindrically shaped reaction chamber and the jigs such as the wafer boat, the gas injector and the boat support from the diffusion reactor.

The cleaning solution supplier has a disc-shape which has a slightly smaller diameter than the top opening of the cylindrically shaped reaction chamber, and the cleaning solution supplier has the plural nozzle holes uniformly distributed throughout the cleaning solution supplier for uniformly distributing the cleaning solution to the cylindrically shaped reaction chamber and the jigs such as the wafer boat, the gas injector and the boat support, whereby a variation of etching amount is prevented. This means that any over-etching is prevented.

The cleaning devices, for example, the cleaning solution supplier and the sloped bottom floor are respectively provided in the dead spaces, for example, the top and bottom openings of the cylindrically shaped reaction chamber. This allows a size reduction of the diffusion reactor and a possible energy saving.

The other present invention provides a diffusion reactor comprising: a reaction chamber having top and bottom openings; a heater provided around the reaction chamber for heating the reaction chamber; an impurity source gas supplying system provided for supplying an impurity source gas into the reaction chamber; a cleaning solution supplier provided under the top opening for spraying a cleaning solution entirely within the reaction chamber to supply the cleaning solution entirely on an inner wall of the reaction chamber and surfaces of the jigs; and a sloped bottom plate provided to close the bottom opening so that the cleaning solution falls onto the sloped bottom plate and flows across the sloped bottom plate.

It is preferable that the sloped bottom plate has a lower level portion provided with a drain for discharging the cleaning solution.

It is also preferable that the reaction chamber is cylindrically shaped and the cleaning solution supplier has a circular-shaped surface facing downwardly and the circular-shaped surface has a diameter slightly smaller than the reaction chamber, and the circular-shaped surface of the cleaning solution supplier has plural nozzle holes distributed over the circular-shaped surface.

It is also preferable that one of the jigs comprises a wafer boat for mounting plural semiconductor wafers and another of the jigs comprises a boat support provided on the sloped bottom plate for supporting the wafer boat.

It is further preferable that the sloped bottom plate is movable to allow the wafer boat to move in and out of the reaction chamber.

The cylindrically shaped reaction chamber has the top and bottom openings, and the cleaning solution supplier is provided in the top opening, whilst the sloped bottom floor is provided to close the bottom opening, so that the cleaning solution is supplied through the cleaning chemical supplier for etching the depositions and further the cleaning solution falls onto the sloped bottom floor and flows across the sloped bottom floor and is collected by the drain. Namely, the cleaning process is carried out without removing the cylindrically shaped reaction chamber and the jigs such as the wafer boat, the gas injector and the boat support from the diffusion reactor.

The cleaning solution supplier has a disc-shape which has a slightly smaller diameter than the top opening of the cylindrically shaped reaction chamber, and the cleaning solution supplier has the plural nozzle holes uniformly distributed throughout the cleaning solution supplier for uniformly distributing the cleaning solution to the cylindrically shaped reaction chamber and the jigs such as the wafer boat, the gas injector and the boat support, whereby a variation of etching amount is prevented. This means that any over-etching is prevented.

The cleaning devices, for example, the cleaning solution supplier and the sloped bottom floor are respectively provided in the dead spaces, for example, the top and bottom openings of the cylindrically shaped reaction chamber. This allows a size reduction of the diffusion reactor and a possible energy saving.

PREFERRED EMBODIMENT

Figure 2:
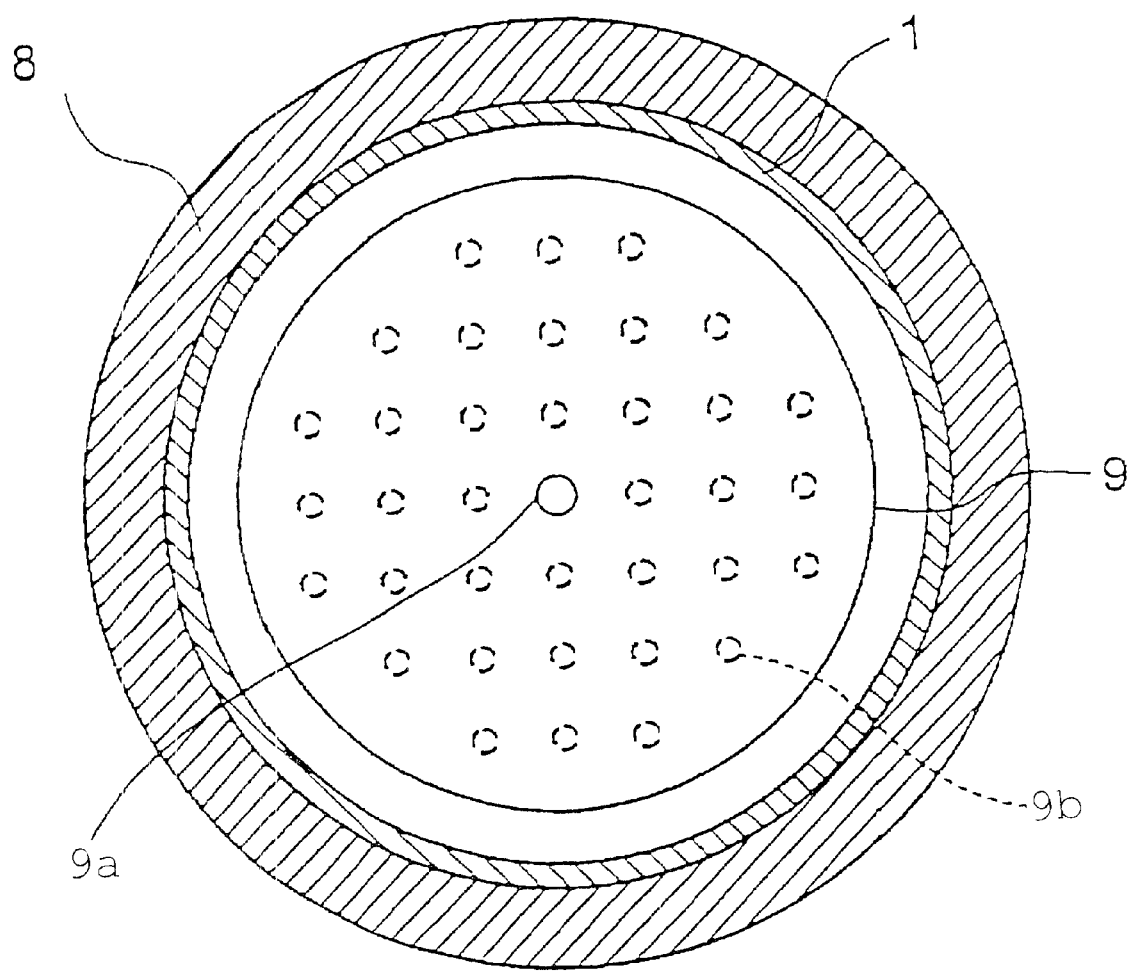
FIG. 2 is a top plan view illustrative of a cylindrically shaped reaction chamber of the novel diffusion reactor of FIG. 1.

A first embodiment according to the present invention will be described in detail with reference to the drawings. FIG. 1 is a cross sectional view illustrative of a novel cylindrically shaped reaction chamber of a diffusion reactor in a first embodiment in accordance with the present invention. FIG. 2 is a top plan view illustrative of a cylindrically shaped reaction chamber of the novel diffusion reactor of FIG. 1.

A cylindrically shaped reaction chamber 1 of the diffusion reactor has a top opening 1a and a bottom opening 1b as well as a cylindrically shaped inner wall 1c. The cylindrically shaped reaction chamber 1 is installed in the diffusion reactor so that a center axis of the cylinder is parallel to a vertical direction. A heater 8 is provided which extends around the side wall of the cylindrically shaped reaction chamber 1. A wafer boat 3 made of quartz is provided for mounting plural semiconductor wafers which receive diffusion of impurity in the cylindrically shaped reaction chamber 1, wherein the semiconductor wafers are amounted to stand against the wafer boat 3. The wafer boat 3 is supported by a boat support 11 which is further connected with a boat elevator for taking the wafer boat 3 into and out of the cylindrically shaped reaction chamber 1 through the bottom opening 1*b*. The wafer boat 3 is rotatable around the center axis of the cylindrically shaped reaction chamber 1. A gas injector 5 is provided inside the side wall of the cylindrically shaped reaction chamber 1, wherein the gas injector 5 extends in a vertical direction and along the inner wall of the cylindrically shaped reaction chamber 1. The gas injector 5 has a vertical alignment of gas injection nozzles 5*a* which face to the wafer boat 3 for injecting impurity source gases, including impurities to be diffused into the semiconductor Wafers. A gas supply tube 7 is also provided which extends along an outer wall of the cylindrically shaped reaction chamber 1, wherein the gas supply tube 7 is connected to the top portion of the cylindrically shaped reaction chamber 1, so that the gas supply tube 7 supplies oxygen at a flow rate in the range of 0.1–5.0 L/min and nitrogen at a flow rate in the range of 5–30 L/min. oxygen and nitrogen serve as subsidiary gases. The subsidiary gases supplied through the gas supply tube 7 and the impurity source gas supplied through the gas injector 5 are reacted with each other on the surfaces of the semiconductor wafers mounted on the wafer boat 3, whereby a glass layer including an impurity contained in the impurity source gas is formed on each of the surfaces of the semiconductor wafers. A heat treatment is later carried out to cause the diffusion of the impurity from the glass layer to the each semiconductor wafer. Wafers. A gas supply tube 7 is also provided which extends along an outer wall of the cylindrically shaped reaction chamber 1, wherein the gas supply tube 7 is connected to the top portion of the cylindrically shaped reaction chamber 1, so that the gas supply tube 7 supplies oxygen at a flow rate in the range of 0.1–5.0 L/min and nitrogen at a flow rate in the range of 5–30 L/min. oxygen and nitrogen serve as subsidiary gases. The subsidiary gases supplied through the gas supply tube 7 and the impurity source gas supplied through the gas injector 5 are reacted with each other on the surfaces of the semiconductor wafers mounted on the wafer boat 3, whereby a glass layer including an impurity contained in the impurity source gas is formed on each of the surfaces of the semiconductor wafers. A heat treatment is later carried out to cause the diffusion of the impurity from the glass layer to the each semiconductor wafer.

The gas injector 5 is connected to an impurity source container 4 for containing an impurity source such as $POCl_3$. An inert gas such as nitrogen is supplied through a mass flow controller 6 to the impurity source container 4 so that the impurity source is subjected to the bubbling and then fed to the gas injector 5.

A cap 12*a* is provided which covers the top opening 1*a* of the cylindrically shaped reaction chamber 1. A cleaning chemical supplier 9 is also provided which extends in a dead space directly under the cap 12*a*. The cleaning chemical supplier 9 is generally disc-shaped so as to have a diameter which is slightly smaller than the top opening 1*a* of the cylindrically shaped reaction chamber 1. The cleaning chemical supplier 9 is connected to a cleaning chemical supply tube 9*a* which extends through the cap 12*a* to the outside of the cylindrically shaped reaction chamber 1. The chemical supplier 9 has an array of nozzle holes 9*b* which are uniformly distributed throughout the cleaning chemical supplier 9 for injecting the chemical through the nozzle holes 9*b*. The cleaning chemical may, for example, be fluoride based chemical. After the cleaning process has been completed, a pure water is then supplied through the cleaning chemical supplier 9.

At the bottom opening 1*b* of the cylindrically shaped reaction chamber 1, a sloped bottom floor 1*d* is provided which has a slope in the range of 15–30 degrees so that the used cleaning chemical flows on the sloped bottom floor 1*d*. A drain 10 is provided at a low level position of the sloped bottom floor 1*d*, so that the used cleaning chemical flows across the sloped bottom floor 1*d* to the drain 10. The boat support 11 is provided at a center position of the sloped bottom floor 1*d*. The sloped bottom floor 1*d* is moved for mounting the boat support 11 which supports the wafer boat 3. The sloped bottom floor 1*d* is moved down and the wafer boat 3 comes out from the bottom opening 1*b* of the cylindrically shaped reaction chamber 1. The sloped bottom floor 1*d* is moved up and the wafer boat 3 comes into the cylindrically shaped reaction chamber 1, whereby the bottom opening 1*b* of the cylindrically shaped reaction chamber 1 is closed by the sloped bottom floor 1*d*.

Operation of the above apparatus and method of cleaning the apparatus will be described. The diffusion processes will be described. The cylindrically shaped reaction chamber 1 is heated by the heater 8 to a temperature in the range of 800–1000° C. A large number, for example, 100–200 of semiconductor wafers are mounted on the wafer boat 3. The sloped bottom floor 1*d* is elevated up and the wafer boat 3 is placed in the cylindrically shaped reaction chamber 1, whereby the bottom opening 1*b* of the cylindrically shaped reaction chamber 1 is closed by the sloped bottom floor 1*d*. A nitrogen gas is fed at a flow rate in the range of 1–5 l/min through the mass flow controller 6 to the impurity source container 4 for subsequent bubbling the impurity source with the nitrogen gas to generate an impurity gas. The impurity gas is fed through the gas injector 5 to the cylindrically shaped reaction chamber 1. Concurrently, oxygen and nitrogen are fed through the gas supply tube 7 at an oxygen flow rate of 0.1–5 l/min and a nitrogen flow rate of 5–30 l/min. The subsidiary gases of oxygen and nitrogen are reacted with the impurity gas on the surfaces of the semiconductor wafers mounted on the wafer boat 3, whereby glass layers are formed on the surfaces of the semiconductor wafers, wherein the glass layer includes an impurity such as phosphorus. Subsequently, a heat treatment is carried out to cause a thermal diffusion of the impurity in the glass layers into the semiconductor wafers. The diffused impurity in the semiconductor wafers is then activated by a further heat treatment.

The cleaning process will subsequently be described. The impurity containing glass layers as the depositions are formed not only on the surfaces of the semiconductor wafers but also on the inner wall of the cylindrically shaped reaction chamber 1 and on surfaces of the jigs such as the wafer boat 3 and the boat supporter 11. The repeated diffusion processes cause further depositions of the impurity containing glass layers. The subsequent heat treatment causes a diffusion of the impurity in the impurity containing glass layers to the inner space of the cylindrically shaped reaction chamber 1. The excess impurity once diffused from the impurity containing glass layers is again diffused into the semiconductor wafers, whereby the excess diffusion of the impurity into the semiconductor wafers is caused, resulting in a drop of the yield of the semiconductor devices.

Further, the depositions on the wafer boat 3 decrease the size of grooves in the wafer boat 3 for standing the semiconductor wafers, whereby an unnecessary force is applied to the wafer boat 3 in mounting and picking up the semiconductor wafers and the wafer boat 3 may fall down. Furthermore, the depositions may cause the sloped bottom floor 1d to adhere to the bottom of the cylindrically shaped reaction chamber 1, whereby the sloped bottom floor 1d cannot be moved up and down and the wafer boat 3 cannot be moved in and out of the cylindrically shaped reaction chamber 1.

For the above reasons, it is necessary that the cylindrically shaped reaction chamber 1, the wafer boat 3, the gas injector 5 and the boat support 11 are subjected to the cleaning process to remove the depositions therefrom. If those parts are removed from the diffusion reactor for the claming process, the removal, cleaning, drying, assembling temperature adjustment processes are necessary and it takes about 72 hours to complete the above sequential processes.

To avoid the above inconvenience, in accordance with the present invention, the cylindrically shaped reaction chamber 1, the wafer boat 3, the gas injector 5 and the boat support 11 are subjected to the cleaning process to remove the depositions therefrom without removing those parts from the diffusion reactor. After the above diffusion processes have been completed, then the sloped bottom floor 1d is elevated down and the semiconductor wafers are picked up from the wafer boat 3. The temperature of the cylindrically shaped reaction chamber 1 is then dropped to the room temperature.

A cleaning chemical, such as a fluoride based chemical, is supplied through the cleaning chemical supply tube 9a and the cleaning chemical supplier 9 to the cylindrically shaped reaction chamber 1. As described above, the cleaning chemical supplier 9 has the plural nozzle holes 9b which are uniformly distributed throughout the cleaning chemical supplier 9 for uniformly distributing the cleaning chemical to the inner wall of the cylindrically shaped reaction chamber 1, the wafer boat 3, the gas injector 5 and the boat support 11. The impurity containing glass layers as the depositions on the cylindrically shaped reaction chamber 1, the wafer boat 3, the gas injector 5 and the boat support 11 are exposed to the fluoride based cleaning chemical. The impurity containing glass layers as the depositions show the following reaction and are etched.

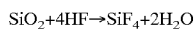

$$SiO_2 + 4HF \rightarrow SiF_4 + 2H_2O$$

The used cleaning chemical then falls onto the sloped bottom floor 1d and flows on the sloped bottom floor 1d and is collected by the drain 10. After the depositions have completely been etched by the cleaning chemicals, pure water is supplied through the cleaning chemical supply tube 9a and the cleaning chemical supplier 9 to the cylindrically shaped reaction chamber 1 for removing the remaining used cleaning chemical. The cleaning water also falls onto the sloped bottom floor 1d and flows on the sloped bottom floor 1d and is collected by the drain 10.

After the cleaning processes have been completed, the cylindrically shaped reaction chamber 1 is heated for carrying out the next diffusion process.

In the above embodiment, the temperature of the cylindrically shaped reaction chamber 1 is once dropped to the room temperature for subsequent supplying the cleaning chemical. It is also possible as a modification to supply the cleaning chemical without dropping the temperature of the cylindrically shaped reaction chamber 1.

As described above, the cylindrically shaped reaction chamber 1 has the top and bottom openings 1a and 1b, and the cleaning chemical supplier 9 is provided in the top opening 1a, whilst the sloped bottom floor 1d is provided to close the bottom opening 1b, so that the cleaning chemical is supplied through the cleaning chemical supplier 9 for etching the depositions and further the cleaning chemical falls onto the sloped bottom floor 1d and flows across the sloped bottom floor 1d to the drain 10. Namely, the cleaning process is carried out without removing the cylindrically shaped reaction chamber 1 and the jigs such as the wafer boat 3, the gas injector 5 and the boat support 11 from the diffusion reactor.

The cleaning chemical supplier 9 has a disc-shape which has a slightly smaller diameter than the top opening 1a of the cylindrically shaped reaction chamber 1, and the cleaning chemical supplier 9 has the plural nozzle holes 9b uniformly distributed throughout the cleaning chemical supplier 9 for uniformly distributing the cleaning chemical to the cylindrically shaped reaction chamber 1 and the jigs such as the wafer boat 3, the gas injector 5 and the boat support 11, whereby a variation of etching amount is prevented. This means that any over-etching is prevented.

The cleaning devices, for example, the cleaning chemical supplier 9 and the sloped bottom floor 1d are respectively provided in the dead spaces, for example, the top and bottom openings 1a and 1b of the cylindrically shaped reaction chamber 1. This allows a size reduction of the diffusion reactor and a possible energy saving.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A reaction chamber having jigs, top and bottom openings and a cleaning system, said cleaning system comprising:

a cleaning solution supplier under said top opening for distributing a cleaning solution within said reaction chamber to supply said cleaning solution onto an inner wall of said reaction chamber and surfaces of said jigs; and a sloped bottom plate that closes said bottom opening so that said cleaning solution falls onto said sloped bottom plate and flows on said sloped bottom plate.

2. The reaction chamber as claimed in claim 1, wherein said sloped bottom plate has a lower level portion provided with a drain for discharging said cleaning solution.

3. The reaction chamber as claimed in claim 1, wherein said reaction chamber is cylindrically shaped and said cleaning solution supplier has a circular-shaped surface facing downwardly and said circular-shaped surface has a diameter slightly smaller than said reaction chamber, and said circular-shaped surface of said cleaning solution supplier has plural nozzle holes distributed over said circular-shaped surface.

4. The reaction chamber as claimed in claim 1, wherein one of said jigs comprises a wafer boat for mounting plural semiconductor wafers and another of said jigs comprises a boat support provided on the sloped bottom plate for supporting the wafer boat.

5. The reaction chamber as claimed in claim 4, wherein said sloped bottom plate is movable to allow the wafer boat to move in and out of the reaction chamber.

6. A diffusion reactor comprising:

a reaction chamber having top and bottom openings;

a heater around said reaction chamber for heating said reaction chamber;

an impurity source gas supplying system for supplying an impurity source gas into said reaction chamber;

a cleaning solution supplier under said top opening for distributing a cleaning solution within said reaction chamber to supply said cleaning solution onto an inner wall of said reaction chamber and surfaces of said jigs; and a sloped bottom plate that closes said bottom opening so that said cleaning solution falls onto said sloped bottom plate and flows on said sloped bottom plate.

7. The diffusion reactor as claimed in claim 6, wherein said sloped bottom plate has a lower level portion provided with a drain for discharging said cleaning solution.

8. The diffusion reactor as claimed in claim 6, wherein said reaction chamber is cylindrically shaped and said cleaning solution supplier has a circular-shaped surface facing downwardly and said circular-shaped surface has a diameter slightly smaller than said reaction chamber, and said circular-shaped surface of said cleaning solution supplier has plural nozzle holes distributed over said circular-shaped surface.

9. The diffusion reactor as claimed in claim 6, wherein one of said jigs comprises a wafer boat for mounting plural semiconductor wafers and another of said jigs comprises a boat support provided on the sloped bottom plate for supporting the wafer boat.

10. The diffusion reactor as claimed in claim 9, wherein said sloped bottom plate is movable to allow the wafer boat to move in and out of the reaction chamber.

* * * * *